United States Patent
Ho et al.

(10) Patent No.: US 7,575,187 B2
(45) Date of Patent: Aug. 18, 2009

(54) MIXING SYSTEM FOR MANUFACTURING THERMAL INTERFACE MATERIAL

(75) Inventors: Chi-Chuang Ho, Tu-Cheng (TW); Bor-Yuan Hsiao, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 92 days.

(21) Appl. No.: 11/447,483

(22) Filed: Jun. 5, 2006

(65) Prior Publication Data

US 2007/0108326 A1 May 17, 2007

(30) Foreign Application Priority Data

Nov. 11, 2005 (CN) ........................... 200510101241

(51) Int. Cl.
*B02C 19/00* (2006.01)
(52) U.S. Cl. ..................................... 241/101.8; 241/235
(58) Field of Classification Search .............. 241/101.2, 241/101.8, 235; 366/101, 137.1, 167.1
See application file for complete search history.

(56) References Cited

U.S. PATENT DOCUMENTS 6,169,142 B1  1/2001  Nakano et al.
6,791,839 B2  9/2004  Bhagwagar

FOREIGN PATENT DOCUMENTS

DE  3925234 A1 *  1/1991
GB  1212939      11/1970

* cited by examiner

*Primary Examiner*—Mark Rosenbaum
(74) *Attorney, Agent, or Firm*—Frank R. Niranjan

(57) ABSTRACT

A mixing system and method for manufacturing a thermal interface material are disclosed. The mixing system mainly includes a mixing chamber having a bottom portion, a first inlet, a second inlet, a spray nozzle, and an outlet. The first inlet is defined in the bottom portion and is configured for inflating a gas into the mixing chamber to form a gas vortex. The second inlet is defined in the mixing chamber and is configured for supplying a plurality of powdery thermally conductive particles to the gas vortex. The spray nozzle is disposed essentially facing the first inlet and is configured for spraying a liquid curable matrix material towards the gas vortex to admix the matrix material and the particles. The outlet is disposed adjacent the gas vortex and is configured for discharging the admixed matrix and particles from the mixing chamber.

8 Claims, 3 Drawing Sheets

MIXING SYSTEM FOR MANUFACTURING THERMAL INTERFACE MATERIAL

TECHNICAL FIELD

The invention relates generally to thermal interface materials and, more particularly, to a mixing method and a mixing system for manufacturing a thermal interface material.

BACKGROUND

Electronic components such as semiconductor chips are becoming progressively smaller, while at the same time heat dissipation requirements thereof are increasing. Commonly, a thermal interface material (hereinafter, TIM) is utilized between the electronic component and a heat sink in order to fill air spaces therebetween thereby promoting efficient heat transfer.

Conventional TIMs are based on thermosetting or thermoplastic polymeric matrices. Nevertheless, the thermal conductivity of conformable polymers is rather low, typically in the range of 0.15 to 0.30 W/mK. To increase the thermal conductivity of the TIMs, thermally conductive particles are generally filled into the polymeric matrices. The thermal conductivity of these filled TIMs depends on various factors, such as, for example, the thermal conductivity of the particles and the packing of the particles in the polymeric matrix including content, density distribution, size and size distribution of the particles.

Generally, the TIM with high content of the particles has a relative high thermal conductivity. However, the higher the content of the particles filled in the TIM, the higher the viscosity of the matrix. Such high viscosity has a disadvantageous influence to the manufacturing processes to obtain desired TIMs, for example, a milling process. Further, the fluidity of these matrices would be relatively decreased due to the high viscosity thereby effacing the effectiveness of the TIM.

At present, a typical method for manufacturing the filled TIM includes a mixing process, i.e., admixing the particles into the matrix. The mixing process is generally performed in a mixing machine by continuously stilling of an agitator to disperse the particles into the matrix. Nevertheless, this stirring cannot bring out a satisfying mixing effect to the particles and the matrix, especially to heavy loading particles. For example, the particles are prone to agglomeration and cannot dispersedly and uniformly admix with the matrix. This would result in an enhanced inner thermal resistance thereby increasing an entire thermal resistance of the TIM. Thus, this mixing method is unsuitable for the manufacturing of the filled TIM.

What is needed, therefore, is a mixing method for manufacturing a TIM that is able to uniformly admix a plurality of particles and a matrix material.

What is also needed, therefore, is a mixing system for manufacturing a TIM.

SUMMARY

In accordance with a preferred embodiment, a mixing system for manufacturing a thermal interface material mainly includes a mixing chamber having a bottom portion, a first inlet, a second inlet, a spray nozzle, and an outlet. The first inlet is defined in the bottom portion and is configured for inflating a gas into the mixing chamber to form a gas vortex. The second inlet is defined in the mixing chamber and is configured for supplying a plurality of powdery thermally conductive particles to the gas vortex. The spray nozzle is disposed essentially facing the first inlet and is configured for spraying a liquid curable matrix material towards the gas vortex to admix the matrix material and the particles. The outlet is defined in the mixing chamber and communicates with the gas vortex. The outlet is configured for discharging the admixed matrix material and particles from the mixing chamber to obtain a thermal interface material.

In accordance with another embodiment, a mixing method for manufacturing a thermal interface material includes the steps of: inflating a gas into a mixing chamber to form a gas vortex; supplying a plurality of powdery thermal conductive particles to the gas vortex; spraying liquid curable matrix material towards the gas vortex to admix the matrix material and the particles; and discharging the admixed matrix material and particles to obtain the thermal interface material.

Other objects, advantages and novel features of the invention will become more apparent from the following detailed description when taken in conjunction with the accompanying drawings.

BRIEF DESCRIPTION OF THE DRAWINGS

Many aspects of the TIM can be better understood with reference to the following drawings. The components in the drawings are not necessarily to scale, the emphasis instead being placed upon clearly illustrating the principles of the present TIM. Moreover, in the drawings, like reference numerals designate corresponding parts throughout the several views.

DETAILED DESCRIPTION OF THE INVENTION

Embodiments of the present TIM will now be described in detail below and with reference to the drawings.

Figure 1:
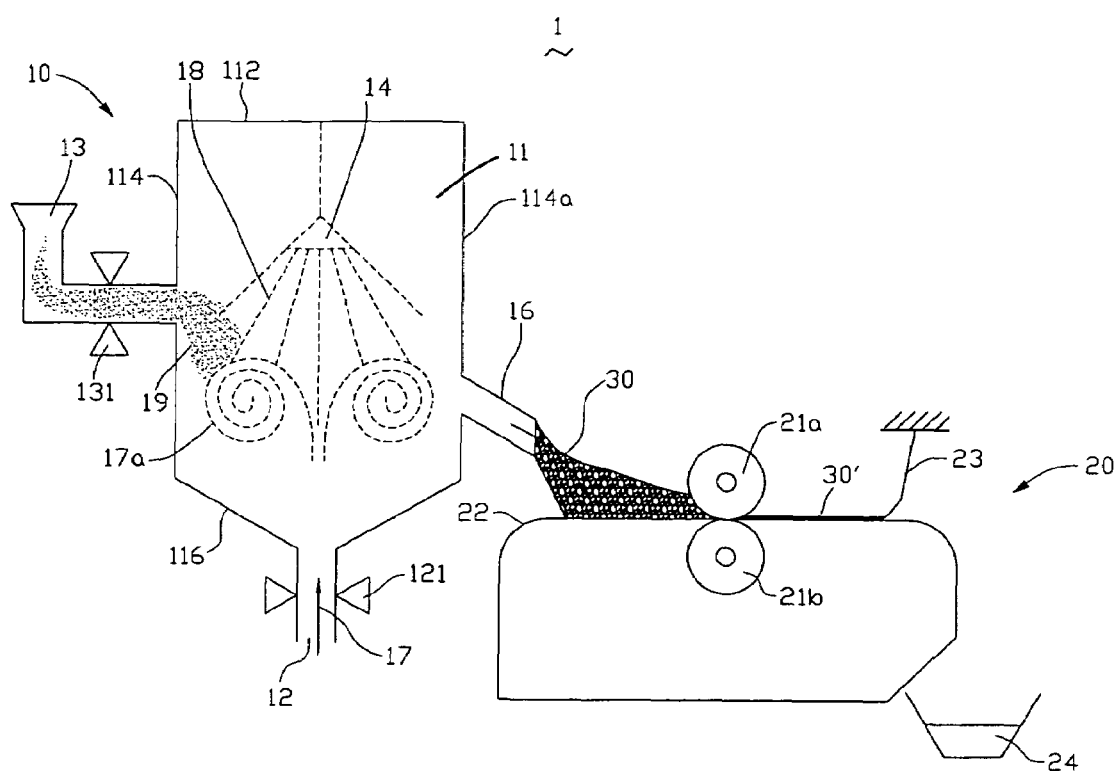
FIG. 1 is a schematic view of a mixing system for manufacturing a TIM according to a preferred embodiment.

FIG. 1 illustrates a mixing system 1 for manufacturing a TIM. The mixing system 1 mainly includes a mixer 10 and a grinding machine 20. The mixer 10 is configured for admixing a plurality of particles 19 in a liquid curable matrix material 18 thereby obtaining a TIM 30. The grinding machine 20 is configured for receiving and grinding the obtained TIM 30.

The mixer 10 mainly includes a mixing chamber 11, a first inlet 12, a second inlet 13, a spray nozzle 14, and an outlet 16. The mixing chamber 11 includes a top portion 112, a plurality of sidewalls 114, a bottom portion 116. The bottom portion 116 is advantageously in a funnel form.

The first inlet 12 is configured for inflating a gas 17 into the mixing chamber 11 and sequentially forming a gas vortex 17a therein. The first inlet 12 is advantageously defined in the funneled bottom portion 116. A gas valve 121 is beneficially located on the first inlet 12, for controlling inflating rate of the gas 17.

The second inlet 13 is configured for supplying the particles 19 to the mixing chamber 11. The second inlet 13 is advantageously defined in one of the sidewalls 114 of the mixing chamber 11. A particle valve 131 is beneficially located on the second inlet 13, for controlling the supplying of the particles 19.

The spray nozzle 14 is configured for spraying the liquid curable matrix material 18 towards the gas vortex 17a in the mixing chamber 11. The spray nozzle 14 is advantageously secured to the top portion 112 and faces the first inlet 12.

The outlet 16 is configured for discharging the admixed matrix material 18 and particles 19 from the mixer 10. The outlet 16 is advantageously defined in an opposite sidewall 114a to the second inlet 13.

The grinding machine 20 mainly includes a transmission belt 22, a pair of rollers 21a and 21b, a scraper 23. The transmission belt 22 is configured for transmitting the discharged TIM 30 from the mixer 10. The two rollers 21a and 21b are beneficially an upper roller 21a and an opposite lower roller 21b. The two rollers 21a, 21b are configured for rolling and grinding the TIM 30 transmitted therebetween. The TIM 30, after grinded by the two rollers 21a, 21b, is in a compact form, i.e., a thin sheet TIM 30'. The thin sheet TIM 30' is generally tightly adhered to the transmission belt 22 due to a strong pressure from the two rollers 21a, 21b. Thus, the scraper 23 is usefully for scraping the sheet TIM 30' off the transmission belt 22. Then, the scraped TIM 30' could be accepted by a receiver 24.

Figure 2:
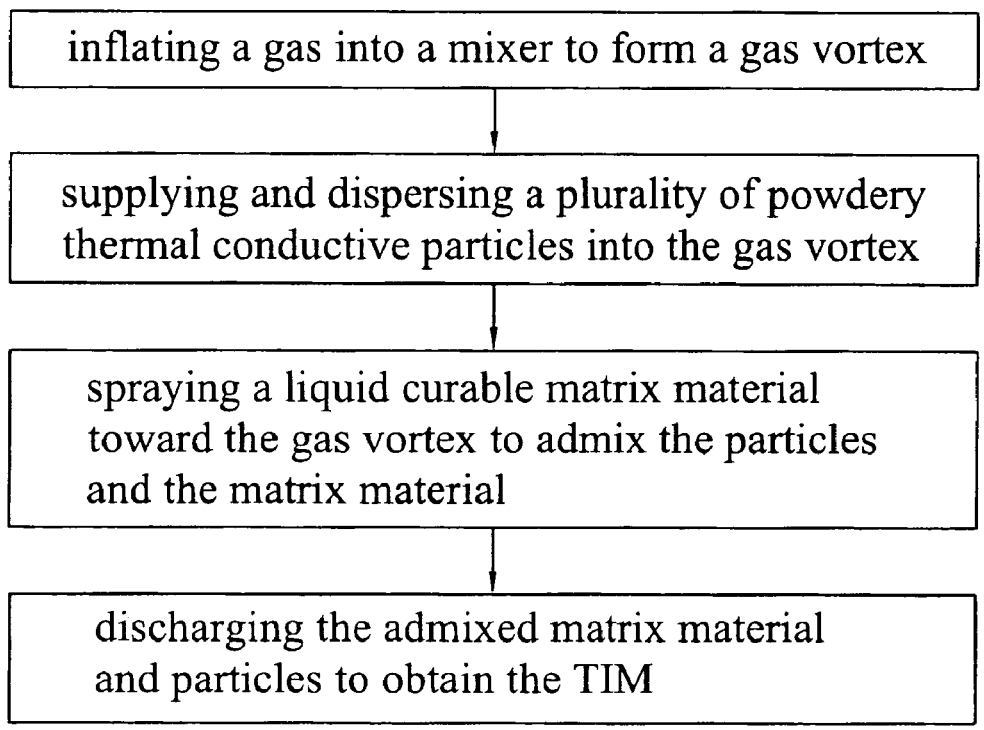
FIG. 2 is a flow chart of a mixing method for manufacturing a TIM using the mixing system of FIG. 1.

FIG. 2 illustrates a mixing method for manufacturing the TIM 30'. The mixing method briefly includes the steps of: inflating a gas into a mixer to form a gas vortex; supplying and dispersing a plurality of powdery thermal conductive particles into the gas vortex; spraying a liquid curable matrix material towards the gas vortex to admix the matrix material and the particles; and discharging the admixed matrix material and particles to obtain the TIM.

In the illustrated embodiment, the gas 17 is blew into the mixer 10 via the first inlet 12 and then forms a gas vortex 17a, as shown in FIG. 1. The gas 17 is advantageously an inert gas, such as, for example, air, nitrogen gas ($N_2$), helium gas (He), neon gas (Ne), or argon gas (Ar).

The powdery thermal conductive particles 19 are advantageously supplied to the gas vortex 17a via the second inlet 13. As such, the supplied particles 19 are beneficially dispersed into the gas vortex 17a and move along with the gas vortex 17a. The particles 19 can thereby form a particle vortex due to continuously inflating gas from the first inlet 12. The particles 19 would not be essentially deposited on the bottom of the mixing chamber 11 due to the funneled bottom portion 116.

The particles 19 are preferably comprised of, for example, a thermally conductive material selected from the group consisting of silver, gold, copper, nickel, aluminum, alumina, zinc oxide, boron nitride, aluminum nitride, graphite, carbon black, and combinations thereof. The particles 19 advantageously have approximate average grain sizes less than 100 nanometers.

The liquid curable matrix material 18 is beneficially sprayed towards the gas vortex 17a via a spray nozzle 14 thereby forming a radial matrix material 18. The radial matrix material 18 moves along with the gas vortex 17a, and thereby fully and uniformly contacts with the powdery thermally conductive particles 19 dispersed along with the gas vortex 17a. At the same time, the dispersed powdery particles 19 uniformly adsorb adjacent matrix material 18. As a result, the radial matrix material 18 and the dispersed powdery particles 19 are uniformly and dispersedly admixed one another due to a uniform contact/adsorption interaction therebetween.

The liquid curable matrix material 18 is advantageously comprised of, for example, a silicone grease or a polyethylene glycol. A ratio of the matrix material 18 to the supplied particles 19 by weight is advantageously in the approximate range from 1:5 to 1:3. The ratio is beneficially maintained during continuously supplying of the particles 19 and continuously spraying of the matrix material 18 thereby effectuating a continuous admixing process for manufacturing a batch production of the TIM 30.

The admixed matrix material 18 and particles 19 are advantageously discharged from the admixing chamber 11 via the outlet 16 thereby obtaining the TIM 30. The admixed matrix material 18 can advantageously be cured at room temperature condition. Thus, during the discharging process, the admixed matrix material 18 can be cured and then forms the composite TIM 30. Alternatively, the admixed matrix material 18 could be cured, e.g., by a heating curing process or an ultraviolet curing process.

Furthermore, the obtained TIM 30 could, advantageously, be grinded via the grinding machine 20. In brief, the obtained TIM 30 is transmitted to the two rollers 21a, 21b via the transmission belt 22. Then, the TIM 30 is subjected to a pressure from the two rollers 21a, 21b and is thereby grinded.

Figure 3:
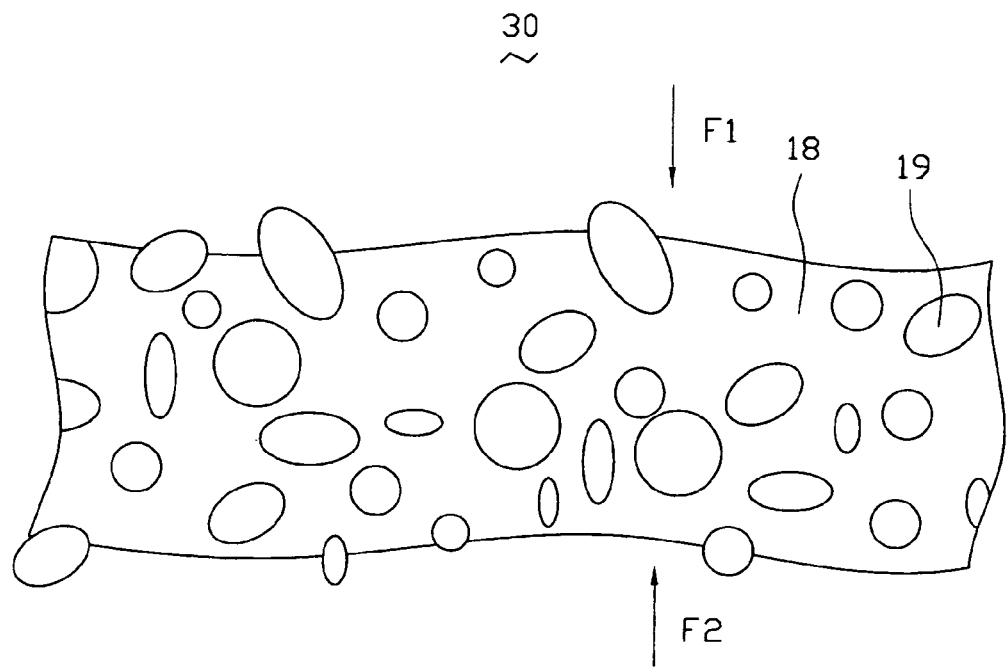
FIG. 3 is a schematic side view of the as-manufactured TIM of FIG. 1, but showing the inner structure of the as-manufactured TIM.
Figure 4:
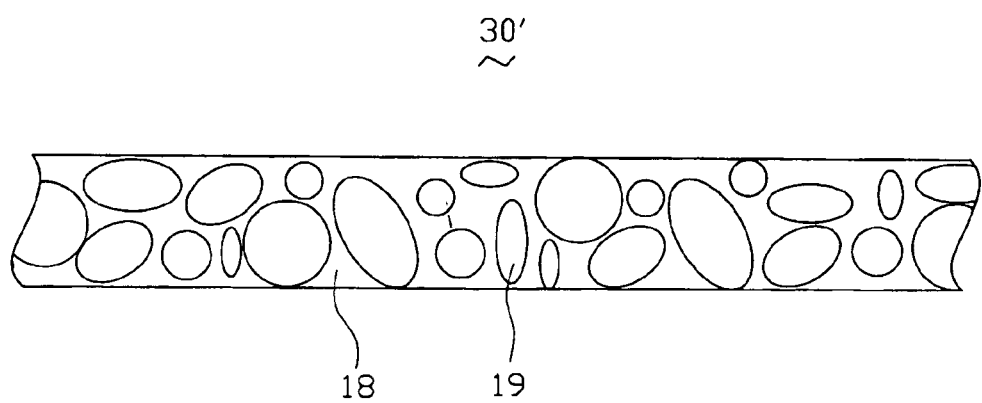
FIG. 4 is a schematic side view of a grinded TIM of FIG. 3, and showing the inner structure of the grinded TIM.

FIG. 3 shows the inner structure of the as-manufactured TIM 30 prior to the grinding of the two rollers 21a and 21b, and FIG. 4 shows the inner structure of the TIM 30' after the grinding of the two rollers 21a and 21b. The adjacent particles 19 in the TIM 30 are dispersedly spaced one another by the matrix material 18, as shown in FIG. 3. However, some matrix material, subjected to a pair of pressure F1 and F2 of the two rollers 21a and 21b, is squeezed out thereby decreasing the space between the adjacent particles 19, as shown in FIG. 4. As such, the particles 19 contact with one another more closely and uniformly thereby promoting the thermal efficiency of the TIM.

Further, because some matrix material 18 is squeezed out from the TIM 30, the content of the particles 19 in the TIM 30' is relatively increased thereby promoting the heat conductivity of the TIM 30'. Even though the content of the particles 19 is high, the total viscosity of the TIM 30' is relatively low. Furthermore, the TIM 30' has a compact structure incorporated the particles 19 with the matrix material 18. As such, this compact TIM 30' is beneficial for sequential particular processes, e.g., a cutting process for attaining an isolating TIM, or a milling process for attaining a TIM with a relative uniform grain size.

It is understood that the above-described embodiments and methods are intended to illustrate rather than limit the invention. Variations may be made to the embodiments and methods without departing from the spirit of the invention. Accordingly, it is appropriate that the appended claims be construed broadly and in a manner consistent with the scope of the invention.

What is claimed is:

1. A mixing system for manufacturing a thermal interface material, comprising:

a mixing chamber comprising a bottom portion;

a first inlet defined in the bottom portion, the first inlet being configured for inflating a gas into the mixing chamber to form a gas vortex;

a second inlet defined in the mixing chamber, the second inlet being configured for supplying a plurality of powdery thermally conductive particles to the gas vortex;

a spray nozzle disposed essentially facing the first inlet, the spray nozzle being configured for spraying a liquid curable matrix material towards the gas vortex to admix the matrix material and the particles;

an outlet defined in the mixing chamber communicating with the gas vortex, the outlet being configured for discharging the admixed matrix material and particles from the mixing chamber to obtain a thermal interface material; and a grinding machine configured for grinding the obtained thermal interface material.

2. The mixing system according to claim 1, wherein the grinding machine comprises a transmission belt configured for transmitting the discharged thermal interface material to be ground, a pair of rollers configured for rolling and grinding the thermal interface material transmitted therebetween, and a scraper configured for scraping the ground thermal interface material off the transmission belt.

3. The mixing system according to claim 1, wherein the bottom portion of the mixing chamber is essentially in a funneled form.

4. The mixing system according to claim 3, wherein the first inlet is defined in the funneled bottom portion of the mixing chamber.

5. The mixing system according to claim 1, wherein the spray nozzle is disposed essentially facing the first inlet.

6. The mixing system according to claim 1, wherein the spray nozzle is a radial spray nozzle.

7. The mixing system according to claim 1, wherein the second inlet is defined in a sidewall of the mixing chamber.

8. The mixing system according to claim 7, wherein the outlet is defined in a sidewall of the mixing chamber opposite to the second inlet.

\* \* \* \* \*